United States Patent
Endo et al.

(10) Patent No.: US 9,293,853 B2
(45) Date of Patent: Mar. 22, 2016

(54) ELECTRIC CONNECTOR WITH TERMINAL SUPPORTS

(71) Applicant: DAI-ICHI SEIKO CO., LTD., Kyoto (JP)

(72) Inventors: Takayoshi Endo, Shizuoka (JP); Sakai Yagi, Shizuoka (JP); Masaru Senmyou, Shizuoka (JP)

(73) Assignee: DAI-ICHI SEIKO CO., LTD., Kyoto (JP)

( * ) Notice: Subject to any disclaimer, the term of this patent is extended or adjusted under 35 U.S.C. 154(b) by 65 days.

(21) Appl. No.: 14/270,718

(22) Filed: May 6, 2014

(65) Prior Publication Data
US 2014/0342606 A1  Nov. 20, 2014

(30) Foreign Application Priority Data

May 20, 2013  (JP) ................................. 2013-106530

(51) Int. Cl.
| | |
|---|---|
| *H01R 13/40* | (2006.01) |
| *H01R 13/422* | (2006.01) |
| *H05K 5/02* | (2006.01) |
| *H01R 43/22* | (2006.01) |

(52) U.S. Cl.
CPC .......... *H01R 13/4223* (2013.01); *H05K 5/0221* (2013.01); *H01R 43/22* (2013.01)

(58) Field of Classification Search
CPC ........................ H01R 13/4223; H01R 13/4362
USPC ................................................. 439/595, 752
See application file for complete search history.

(56) References Cited

U.S. PATENT DOCUMENTS

| | | | | | |
|---|---|---|---|---|---|
| 5,859,534 | A | * | 1/1999 | Saijo ...................... | H01R 43/20 324/538 |
| 6,488,536 | B2 | * | 12/2002 | Fukamachi ........ | H01R 13/4223 439/595 |
| 7,097,503 | B2 | * | 8/2006 | Tsuji .................. | H01R 13/4365 439/595 |
| 8,147,279 | B1 | * | 4/2012 | Martin ............... | H01R 13/4223 439/346 |

(Continued)

FOREIGN PATENT DOCUMENTS

| | | |
|---|---|---|
| CN | 103022778 | 4/2013 |
| EP | 1170832 A2 | 1/2002 |

(Continued)

OTHER PUBLICATIONS

Extended European Search Report issued Sep. 4, 2014 in corresponding European Patent Application No. 14166536.4.

*Primary Examiner* — Hae Moon Hyeon
(74) *Attorney, Agent, or Firm* — Wenderoth, Lind & Ponack, L.L.P.

(57) ABSTRACT

The electric connector includes an electrically insulative housing forming therein a terminal space, with a terminal inserted into the terminal space. The terminal includes a sheath section, and an engagement section formed at the sheath section. A lance protrudes towards an axis of the terminal space in the housing, and the lance is engaged to and disengaged from the engagement section. A resilient support supports the lance such that the lance can be resiliently deformed in a direction away from the axis, and the housing has a path through which a jig can be inserted into the housing towards the lance. A pair of terminal supports situated horizontally face each other such that the jig inserted into the housing through the path is located therebetween, and make contact with the sheath section when the terminal is inserted into the housing.

7 Claims, 14 Drawing Sheets

(56) References Cited

U.S. PATENT DOCUMENTS

| | | |
|---|---|---|
| 2002/0002001 A1 | 1/2002 | Fukamachi |
| 2004/0248449 A1 | 12/2004 | Martin |
| 2014/0370757 A1* | 12/2014 | Endo .................. H01R 13/4223 439/626 |
| 2015/0200492 A1* | 7/2015 | Endo .................... H01R 13/639 439/345 |
| 2015/0222040 A1* | 8/2015 | Endo .................... H01R 13/424 439/595 |
| 2015/0222043 A1* | 8/2015 | Yagi .................... H01R 13/502 439/625 |

FOREIGN PATENT DOCUMENTS

| | | |
|---|---|---|
| EP | 1484821 A1 | 12/2004 |
| JP | 3-55674 | 5/1991 |
| JP | 2003-243079 | 8/2003 |
| JP | 2003-257531 | 9/2003 |
| JP | 2004-39498 | 2/2004 |
| JP | 2004-247227 | 9/2004 |
| JP | 2011-253717 | 12/2011 |
| JP | 2013-069537 | 4/2013 |
| KR | 10-2008-0024629 | 3/2008 |

* cited by examiner

ELECTRIC CONNECTOR WITH TERMINAL SUPPORTS

BACKGROUND OF THE INVENTION

1. Field of the Invention

The invention relates to an electric connector equipped in a wire harness for electrically connecting a circuit board and the wire harness to each other. The invention relates further to a housing employed in the electric connector.

2. Description of the Related Art

FIG. 12 illustrates a conventional electric connector 500, FIG. 13 is a cross-sectional view of the electric connector 500 viewed in a direction of an arrow B shown in FIG. 22, and FIG. 14 is a cross-sectional view of the electric connector 500 viewed in a direction of the arrow B.

As illustrated in FIG. 12, the electric connector 500 includes a housing 50 composed of an electrically insulative material, and a plurality of terminals 60 to be inserted into terminal spaces 51 formed in the housing 50 in a direction from a rear to a front of the housing 50.

Each of the terminals 60 includes a sheath section 61 having a square cross-section and formed at a front in a direction in which the terminal 60 is inserted into the housing 50, and a wire compression section 62 formed at a rear in the direction. A wire (not illustrated) exposed out of a cover of a cable 63 is fixed in the wire compression section 62 in a compressed condition to thereby electrically connect the cable 63 and the terminal 60 to each other. Each of the terminals 60 is formed at a front end of the sheath section 61 with an engagement section 64 protruding away from a center axis 61c of the sheath section 61.

Each of the terminal spaces 51 formed in the housing 50 is formed therein with a lance 53 protruding towards an axis 51c of the terminal space 51, and a resilient support 54 supporting the lance 53 such that the lance 53 is able to be deformed towards and away from the axis 51c of the terminal space 51. As illustrated in FIG. 12, the terminal 60 is inserted into the housing 50 through a rear opening 51b formed at the rear of the housing 50, and then, is pushed into the housing 50. After the engagement section 64 is slid along the lance 53 and passed over the lance 53, the engagement section 64 is engaged with the lance 53. Thus, the terminal 60 is fixed in the terminal space 51.

In the case that there occurs a defect in electric connection in the electric connector 500, for instance, the terminal 60 must be pulled out of the housing 50, in which case, it is necessary to disengage the engagement section 64 and the lance 53 from each other. A jig 70 in the form of a thin plate is used to do so. As illustrated in FIGS. 12 and 13, the jig 70 is inserted into the housing 50 towards a rear of the housing 50 through an opening 55 formed adjacent to a front opening 51a formed at a front of the housing 50. Then, as illustrated in FIG. 14, the jig 70 is pushed downwardly at a proximal end 70b thereof. The jig 70 lifts up a part of the resilient support 54 through a distal end 70a thereof moving in the counter direction under the principles of the lever and fulcrum to thereby cause the resilient support 54 to be deformed upwardly, resulting in that the lance 53 is released from the engagement section 64. Then, the terminal 60 is pulled out of the housing 50 through the rear opening 51b of the terminal space 51.

Japanese Patent Application Publication No. 2004-39498 suggested a connector including a lance supported at front and rear ends thereof. A part of the lance forwardly protruding an engagement surface is designed to be branched into two sections.

Japanese Patent Application Publication No. 2004-247227 suggested a connector including a lance supported at front and rear ends thereof, and designed to be deformable around the front and rear ends. There is formed a space between a terminal and a front of the lance. A disengagement portion of a jig can be inserted into the space.

Recently, an electric connector is required to have a small size and a low height. Accordingly, the partition wall 56 defining the terminal spaces 51 in the housing 50 and the resilient support 54 supporting the lance 53 are designed to be thin, and the opening 55 through which the jig 70 is inserted into the housing 50 is designed to be small.

However, if the opening 55 were designed to be small in response to the requirement of designing an electric connector to be small in both, a size and a height, a part for forming the opening 55 in an injection mold used for molding the housing 50 has to be thin, resulting in that the injection mold might be deformed and/or damaged. Furthermore, if the opening 55 were designed to be small, the distal end 70a of the jig 70 to be inserted into the housing 50 through the opening 55 has to be designed to be thin, resulting in reduction in a strength of the jig 70.

The above-mentioned problem is found also in the above-mentioned Publications, but remains unsolved.

SUMMARY OF THE INVENTION

In view of the above-mentioned problems in the conventional electric connectors, it is an object of the present invention to provide an electric connector capable of avoiding an injection mold used for making a connector housing from being deformed and/or damaged, and further of avoiding reduction in a strength of a jig used for disengaging a lance and a terminal from each other.

It is further an object of the present invention to provide a housing suitable for the above-mentioned electric connector.

In one aspect of the present invention, there is provided an electric connector including a housing being composed of an electrically insulative material and forming therein a terminal space, a terminal inserted into the terminal space, the terminal including a sheath section, and an engagement section formed at the sheath section, a lance protruding towards an axis of the terminal space in the housing, the lance being engaged to and disengaged from the engagement section, a resilient support supporting the lance such that the lance can be resiliently deformed in a direction away from the axis, a path through which a jig can be inserted into the housing towards the lance, and a pair of terminal supports situated horizontally facing each other such that the jig inserted into the housing through the path is located therebetween, and making contact with the sheath section when the terminal is inserted into the housing.

In the electric connector in accordance with the present invention, since a terminal inserted into the terminal space is supported at the sheath section thereof by the terminal support(s), it is possible to stably support a terminal having been inserted into the terminal space, avoiding an opening through which a jig is inserted into the housing, from being narrowed.

Accordingly, it is possible to avoid a part of an injection mold by which an opening through which a jig is inserted into a housing is formed, from being thin, ensuring that an injection mold used for making a connector housing can be prevented from being deformed and/or damaged. Furthermore, since the path through which a jig is inserted into a housing can be formed relatively wide, it is possible to avoid a jig inserted into a housing through the path for disengaging the lance and the terminal from each other from being thin, ensuring that reduction in a strength of the jig can be avoided.

It is preferable that the engagement section protrudes towards an axis of the sheath section.

Since the engagement section of the terminal protrudes towards the inside of the sheath section (that is, towards an axis of the sheath section), and does not protrude outwardly (that is, in a direction away from an axis of the sheath section) beyond the sheath section, it is possible to form the path wide.

Accordingly, a part of an injection mold by which the path through which a jig is inserted into a housing is formed can be avoided from being deformed and/or damaged, and further, the strength of the jig will not be reduced.

It is preferable that the resilient support defines a wall by which the housing is partitioned to form the terminal space.

By so designing the resilient support, the electric connector can he designed to be small in both a size and a height.

It is preferable that the electric connector further includes a pressure transmitter formed in the path for deforming the lance in a direction away from the terminal when pressurized by the jig inserted into the housing through the path.

By designing the electric connector to further include the pressure transmitter, it is possible to disengage the lance from the terminal merely by inserting the jig into the housing through the path, ensuring that the steps for disengaging the lance from the terminal can be simplified.

It is preferable that the pressure transmitter comprises an inclined surface inclining in a direction in which the inclined surface comes closer to the axis of the terminal space in a direction in which the jig is inserted into the housing.

Since the lance can he disengaged from the terminal by virtue of a pressure exerted by the jig when the jig is inserted into the housing, the steps for disengaging the lance from the terminal can he simplified.

Furthermore, it is possible to enhance a strength of both the lance and the resilient support.

In another aspect of the present invention, there is provided a housing used for an electric connector into which a terminal is detachably inserted, the terminal including a sheath section, and an engagement section formed at the sheath section, the housing being composed of an electrically insulative material and forming therein a terminal space into which the terminal is inserted, the housing including a lance protruding towards an axis of the terminal space in the housing, the lance being engaged to and disengaged from the engagement section, a resilient support supporting the lance such that the lance can be resiliently deformed in a direction away from the axis, a path through which a jig can be inserted into the housing towards the lance, and a pair of terminal supports situated horizontally facing each other such that the jig inserted into the housing through the path is located therebetween, and making contact with the sheath section when the terminal is inserted into the housing.

The advantages obtained by the aforementioned, present invention will be described hereinbelow.

The present invention makes it possible to avoid an injection mold used for making a connector housing from being deformed and/or damaged, and further, to avoiding reduction in a strength of a jig used for disengaging a lance and a terminal from each other.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

(First Embodiment)

An electric connector 100 in accordance with the first embodiment of the present invention is explained hereinbelow with reference to FIGS. 1 to 9.

As illustrated in FIGS. 1 to 5, the electric connector 100 includes a housing 10 composed of an electrically insulative material and defining therein a plurality of terminal spaces 11 extending in parallel with one another, and terminals 20 each inserted into a respective one of the terminal spaces 11 towards a front from a rear of the housing 10 in a direction indicated with an arrow X.

Figure 3:
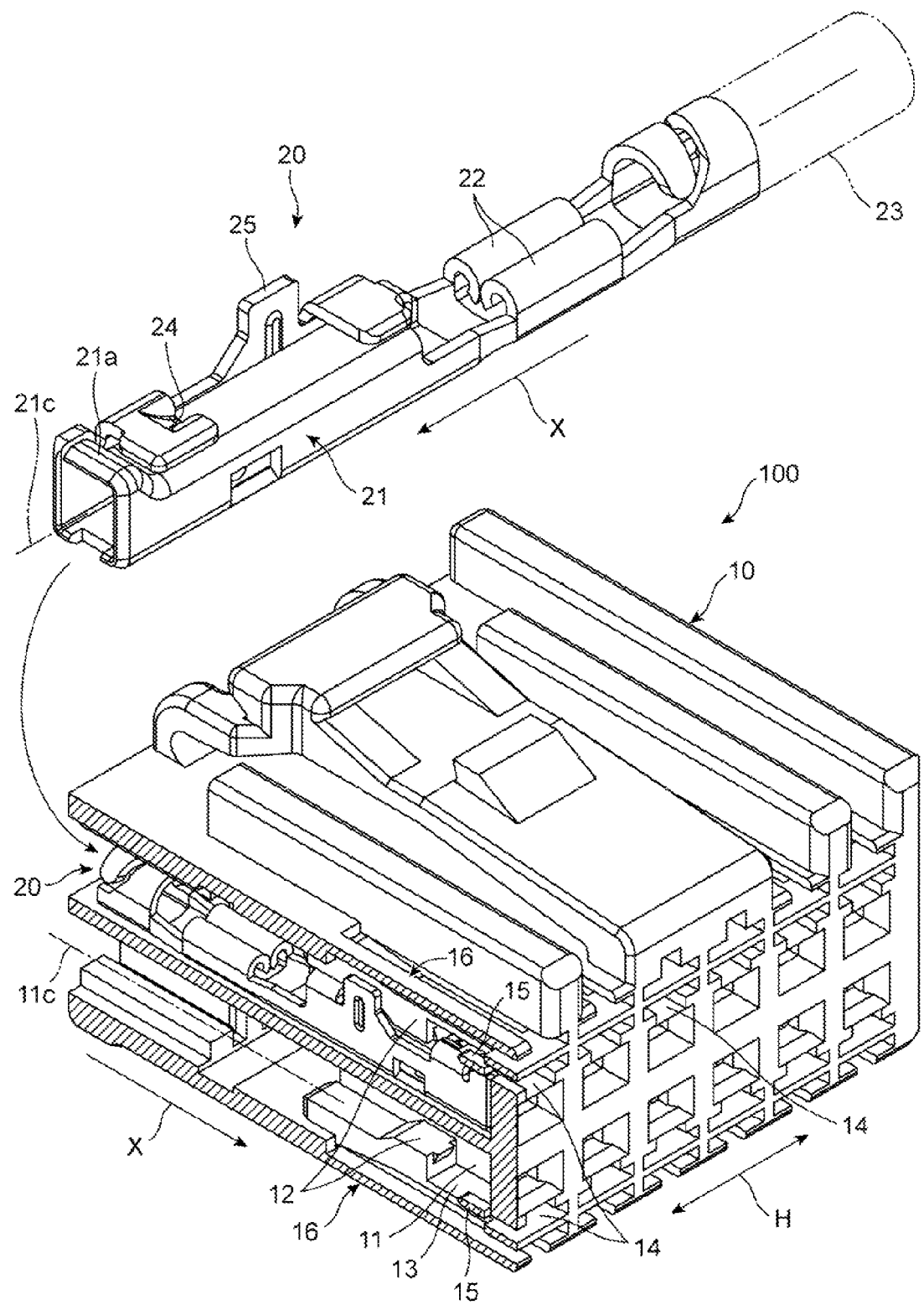
FIG. 3 is a cross-sectional perspective view taken along the line B-B shown in FIG. 2.
Figure 4:
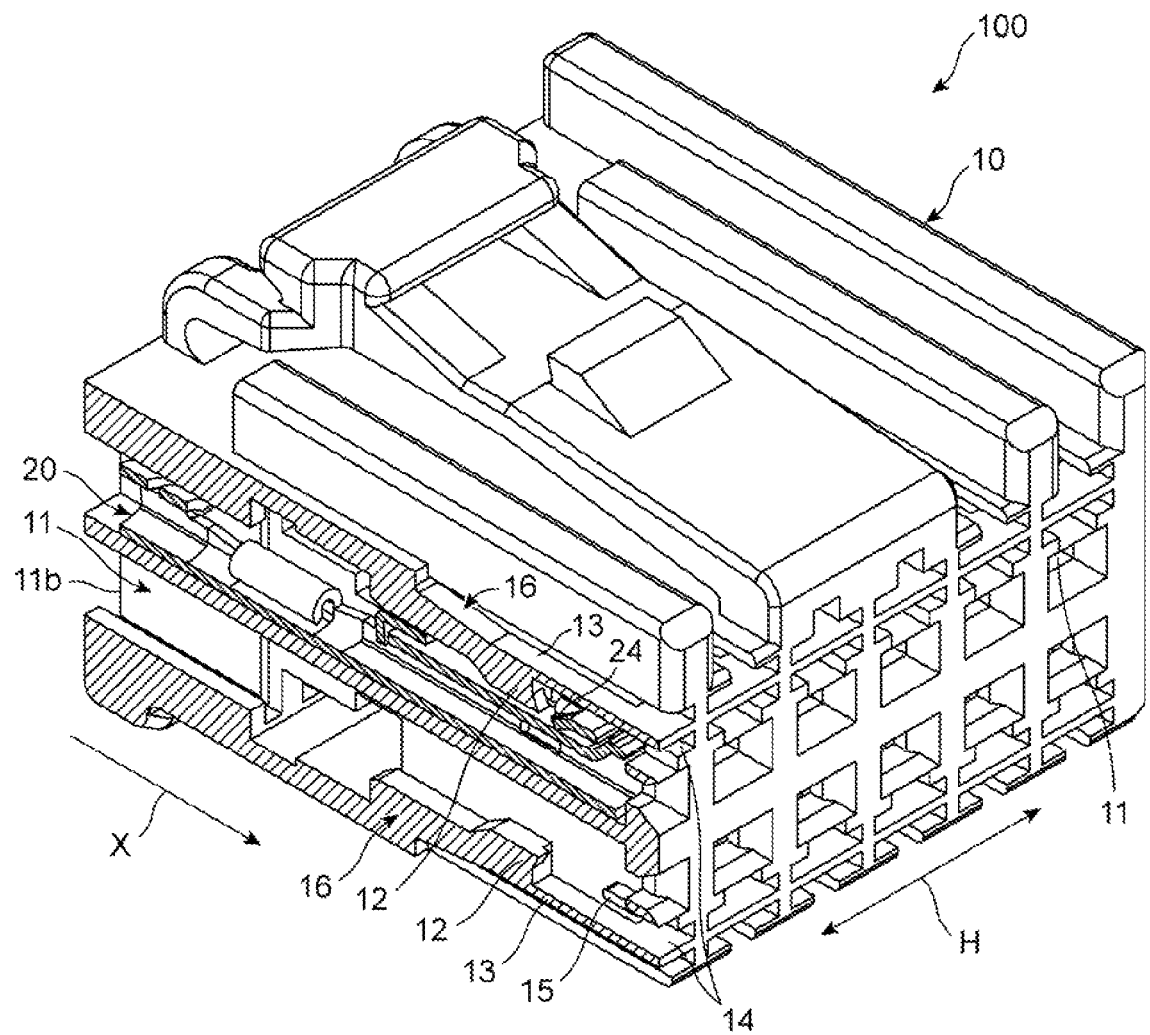
FIG. 4 is a cross-sectional perspective view taken along the line C-C shown in FIG. 2.

As illustrated in FIG. 3, each of the terminals 20 includes a sheath section 21 having a square cross-section and formed at a front in a direction in which the terminal 20 is inserted into the housing 10 (that is in a direction X), and a wire compression section 22 formed at a rear in the above-identified direction. A wire (not illustrated) exposed out of a cover of a cable 23 is fixed in the wire compression section 22 in a compressed condition to thereby electrically connect the cable 23 and the terminal 20 to each other. Each of the terminals 20 is formed at a front end of the sheath section 21 with an engagement section 24 protruding towards an axis 21c of the sheath section 21.

The housing 10 includes a lance 12 protruding towards an axis 11c of the terminal space 11, and the lance 12 is able to be engaged to and disengaged from the engagement section 24. A resilient support 13 supports the lance 12 such that the lance 12 can be resiliently deformed in a direction away from the axis 11c of the terminal space 11 and the resilient support 13 defines a wall by which the housing 10 is partitioned to form the terminal space 11. The housing also includes a path 14 through which a jig 30 is inserted into the terminal space 11 through a front of the housing 10 towards the lance 12 along the engagement section 24. The jig 30 is used for disengaging the lance 12 and the terminal 20 from each other. The resilient support 13 is formed on or 25 integral with a partition wall 16 partitioning the housing 10 into a plurality of the terminal spaces 11.

Figure 5:
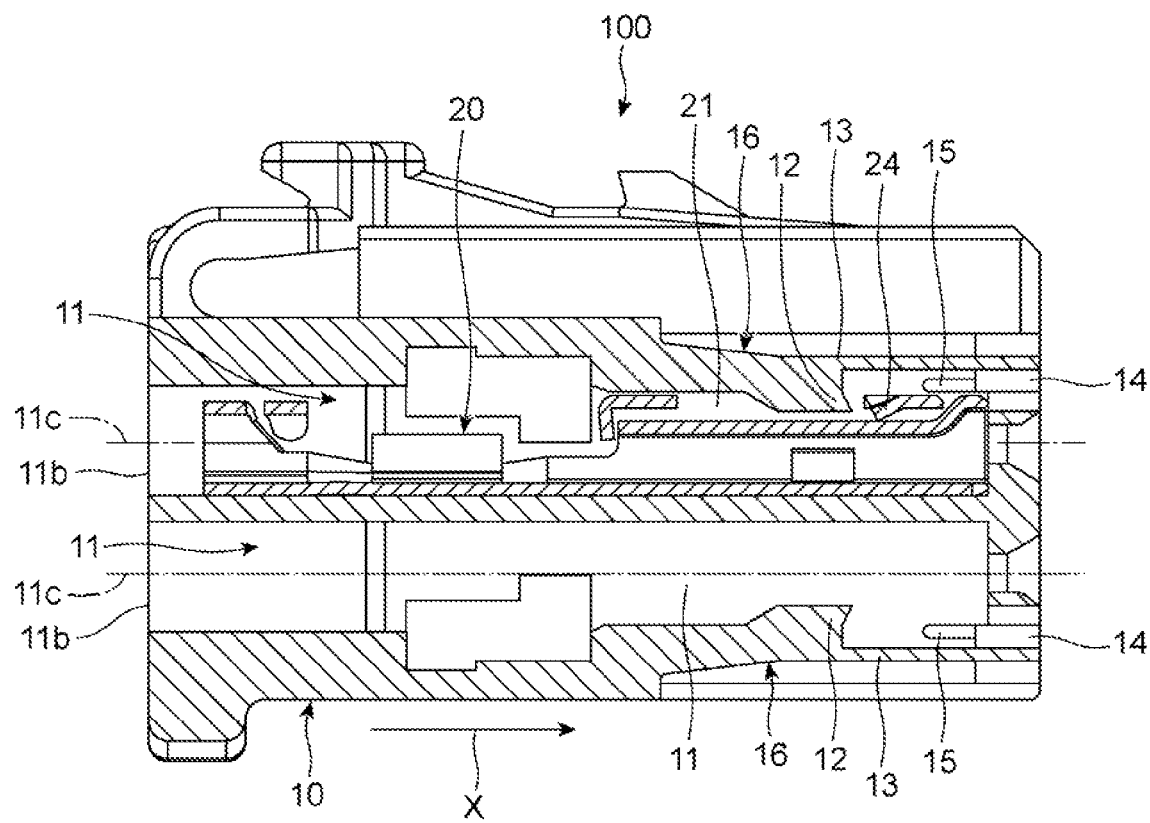
FIG. 5 is a cross-sectional view taken along the line C-C shown in FIG. 2.

As illustrated in FIGS. 3 and 5, the terminal 20 is inserted into the housing 10 through a rear opening 11b of the terminal space 11, and then, is pushed further into the housing 10 in the direction X. Thus, the engagement section 24 of the terminal 20 and the lance 12 protruding into the terminal space 11 push each other to thereby cause the resilient support 13 supporting the lance 12 to be deformed.

The engagement section 24 slides across the lance 12 with the lance 12 being deformed in a direction away from the central axis 11c, and when the engagement section 24 passes over the lance 12, the lance 12 returns to its original position by virtue of a resilient reaction force exerted by the resilient support 13. Thus, the lance 12 and the engagement section 24 face each other in a direction of the central axis 11c, and hence, the terminal 20 remains engaged in the terminal space 11, even if the terminal 20 is pulled in a direction opposite to the direction X.

Figure 2:
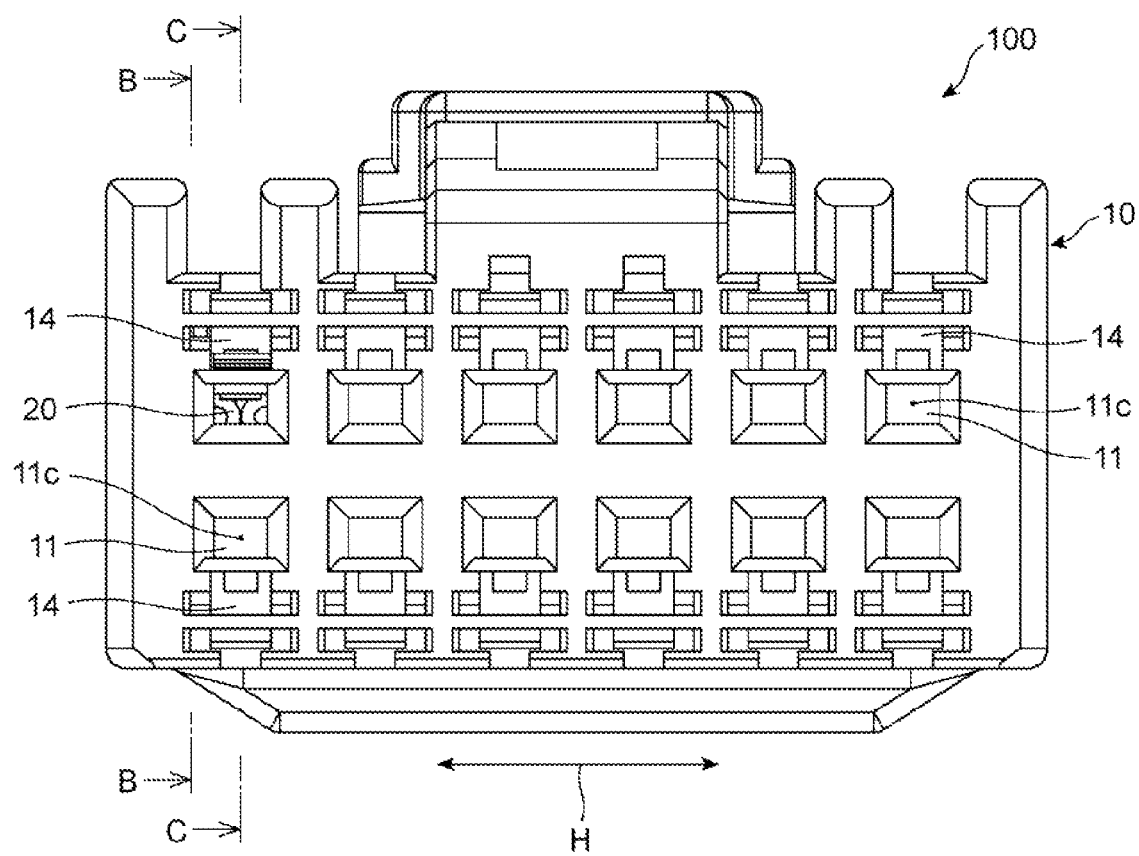
FIG. 2 is a front view of the electric connector, viewed in a direction indicated with the arrow A shown in FIG. 1.

As illustrated in FIGS. 3 to 8, the housing 10 includes a pair of terminal supports 15 in each of the terminal spaces 11. The terminal supports 15 are situated facing each other in a horizontal direction (that is, in a direction indicated with an arrow H) with the jig 30 inserted into the terminal space 11 through the path 14, being located therebetween, and are designed to make contact with the sheath section 21 of the terminal 20. As mentioned earlier, when the terminal 20 is inserted into the terminal space 11, the sheath, section 21 of the terminal 20 is supported at a front upper edge 21a thereof with a pair of the terminal supports 15. In the specification, a horizontal direction (a direction indicated with the arrow H) indicates a width-wise direction of the housing 10, that is, a direction in which a plurality of the paths 14 are arranged at a front of the electric connector 100, as illustrated in FIG. 2.

As illustrated in FIG. 3, the engagement section 24 of the terminal 20 is designed to protrude towards an inside of the sheath section 21. In other words, the engagement section 24 is recessed relative to an outer surface of the terminal 20. Thus, since the terminal 20 includes no portions outwardly (that is, in a direction away from the axis 21C of the sheath section 21) protruding beyond the sheath section 21 other than a protruding section 25, the path 14 can be formed large.

Accordingly, it is possible to avoid a part of an injection mold (not illustrated) by which the path 14 through which the jig 30 is inserted into the housing 10 is formed, from being thin, ensuring that the injection mold can avoid being deformed and/or damaged. Furthermore, since the path 14 through which the jig 30 is inserted into the housing 10 can avoid being formed narrow, it is possible to prevent the jig 30 inserted into the housing 10 through the path 14 for disengaging the lance 12 and the terminal 20 from each other, from being thin, ensuring that reduction in a strength of the jig 30 can be avoided.

Figure 6:
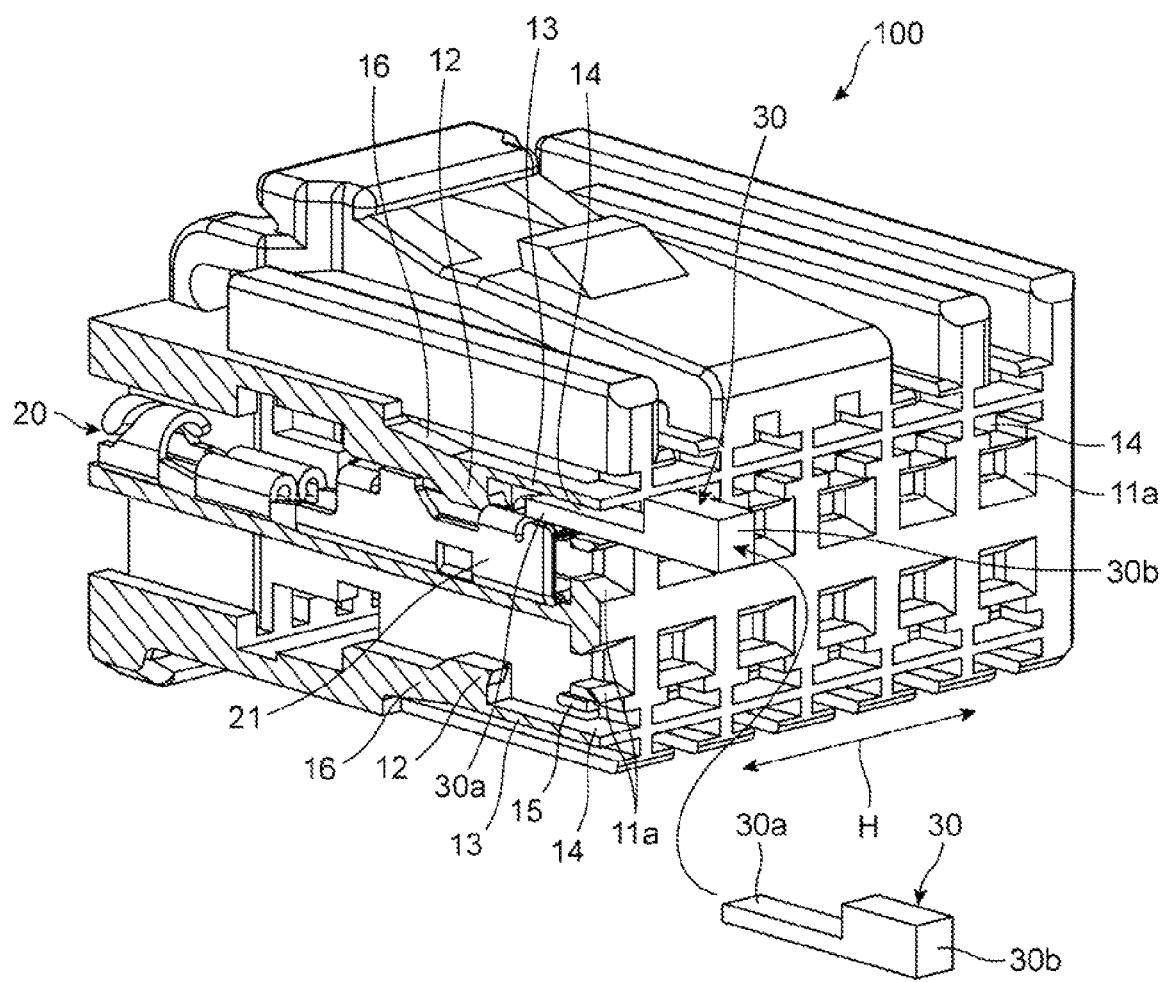
FIG. 6 is a cross-sectional perspective view of the electric connector in accordance with the first embodiment of the present invention, illustrating that a jig is inserted into the electric connector.
Figure 7:
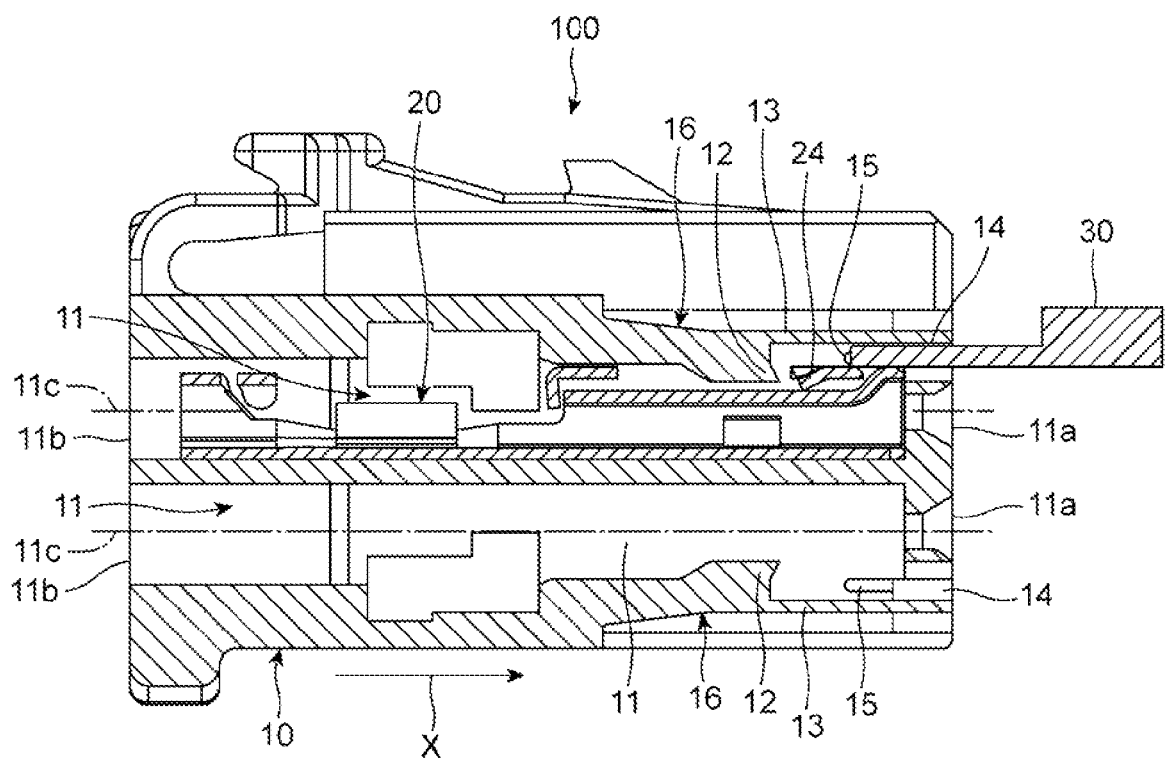
FIG. 7 is a cross-sectional, perspective view of the electric connector in accordance with the first embodiment of the present invention, illustrating that a jig is inserted into the electric connector.

In the case of a defect in the electrical connection in the electric connector 100, for instance, it is necessary to pull the terminal 20 out of the housing 10 to repair the terminal 20 or change the terminal 20 into a new one. In that case, since it is necessary to disengage the engagement section 24 of the terminal 20 inserted into the terminal space 11 and the lance 12 from each other, the jig 30 is used to do so. FIG. 6 illustrates an example of the jig 30. As illustrated in FIG. 6, the jig 30 includes a base 30b in the form of a rectangular or square, pole, and an insertion portion 30a in the form, of a plate, extending from, an end of the base 30b.

Figure 1:
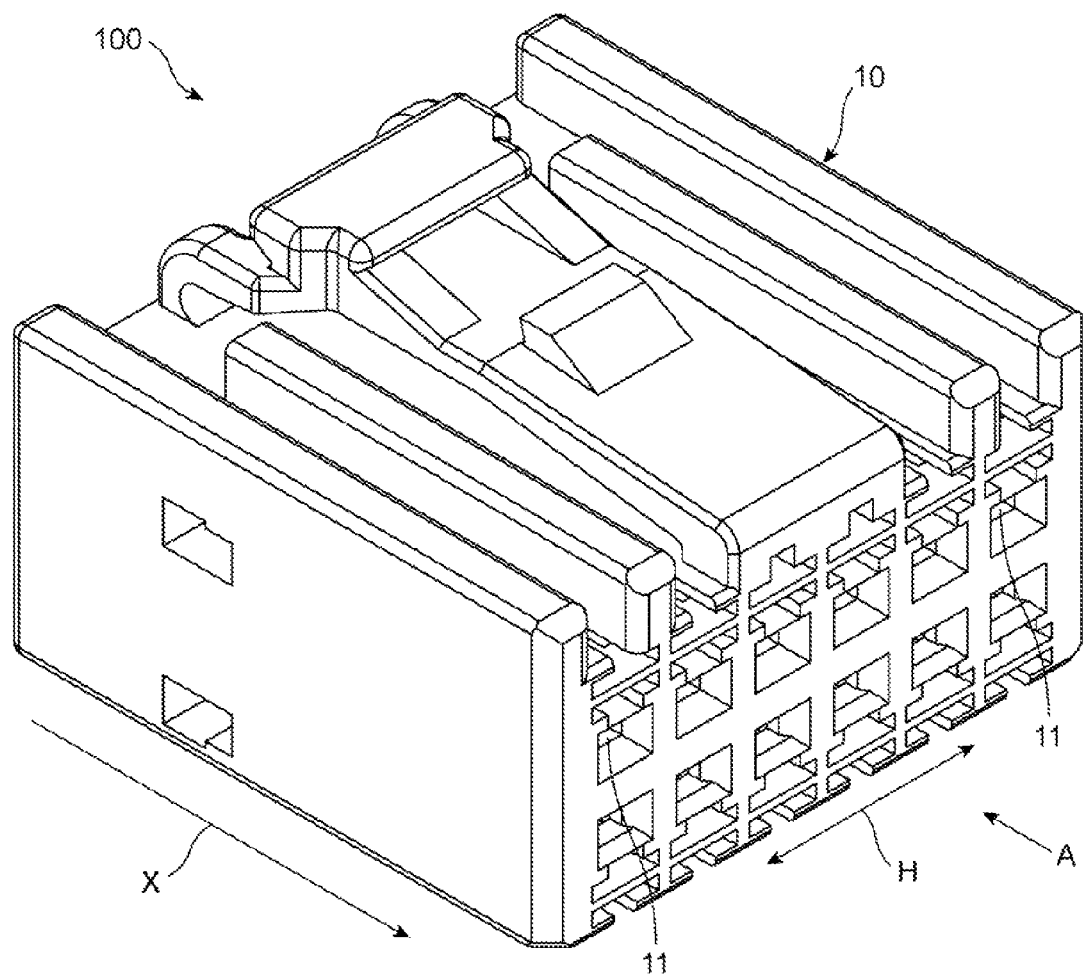
FIG. 1 is a perspective view of the electric connector in accordance with the first embodiment of the present invention.
Figure 8:
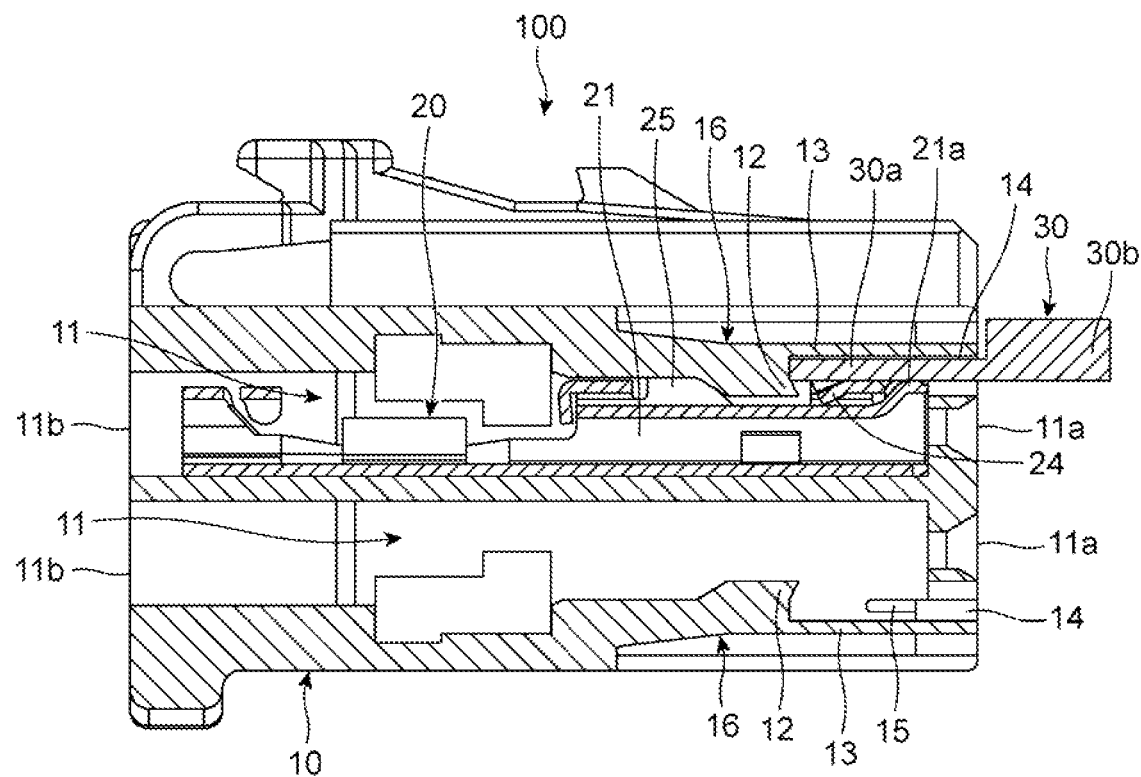
FIG. 8 is a cross-sectional perspective view of the electric connector in accordance with the first embodiment of the present invention, illustrating that a jig is inserted, into the electric connector.

As illustrated in FIG. 1, the jig 30 is inserted at the insertion portion 30a into the terminal space 11 towards a rear of the housing 10 through an opening of the path 14 located adjacent to the front opening 11a of the terminal space 11. Then, as illustrated in FIG. 8, the insertion portion 30a is caused at a distal end thereof to make contact with a front of the lance 12.

Figure 9:
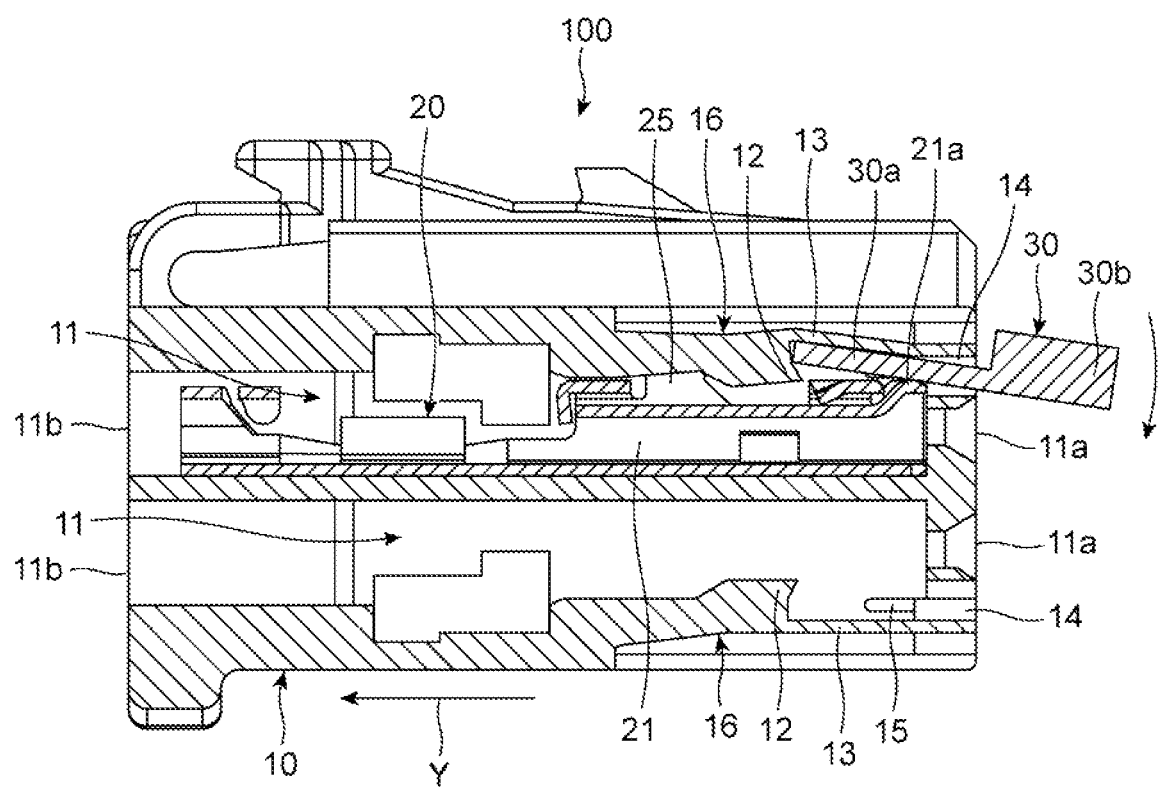
FIG. 9 is a cross-sectional view of the electric connector in accordance with the first embodiment of the present invention, illustrating that the lance is disengaged from the terminal by means of a jig inserted into the electric connector.

Then, as illustrated in FIG. 9, the jig 30 is inclined such that the base 30b goes towards the axis 11c of the terminal space 11, resulting in that the insertion portion 30a moves in a direction opposite to the base 30b. That is, the insertion portion 30a moves obliquely upwardly, around the front upper edge 21a of the terminal 20 acting as a fulcrum, based on the principles of the lever and fulcrum. The upwardly moving insertion portion 30a lifts up a portion of the resilient support 13 to thereby cause the resilient support 13 to be upwardly deformed, resulting in that the lance 12 moves away from the engagement section 24. Then, the terminal 20 can be taken out of the terminal space 11 through the rear opening 11b by pulling the terminal 20 in a direction (a direction indicated with the arrow Y) opposite to the direction in which the terminal 20 is inserted into the terminal space 11.

As mentioned earlier, the electric connector 100 in accordance with the first embodiment makes it possible to form the path 14 to be large.

Accordingly, it is possible to prevent a part of an injection mold by which the path 14 through which the jig 30 is inserted into the terminal space 11 is formed, from being thin, ensuring that the injection mold can avoid being deformed and/or damaged. Furthermore, since the path 14 through which the jig 30 is inserted into the terminal space 11 can be formed relatively wide, it is possible to prevent the insertion portion 30a of the jig 30 from being thin, ensuring that reduction in a strength of the jig 30 can be avoided.

Furthermore, since the resilient support 13 supporting the lance 12 in the terminal space 11 of the housing 10 such that the lance 12 is able to move towards and away from, the axis 11c is formed on or integral with the partition wall 16 partitioning the housing 10 into a plurality of the terminal spaces 11, the electric connector 100 can be designed to he clown sized and low in height.

In addition, the housing 10 is designed to include a pair of the terminal supports 15 situated facing each other in a horizontal direction (that is, in the direction H) with the jig 30 inserted into the terminal space 11 through the path 14, being located therebetween, and able to make contact with the front upper edge 21a of the sheath section 21 of the terminal 20.

Accordingly, it is possible to prevent the path 14 from being narrow, and to stably support the terminal 20 inserted into the terminal space 11.

(Second Embodiment)

Figure 10:
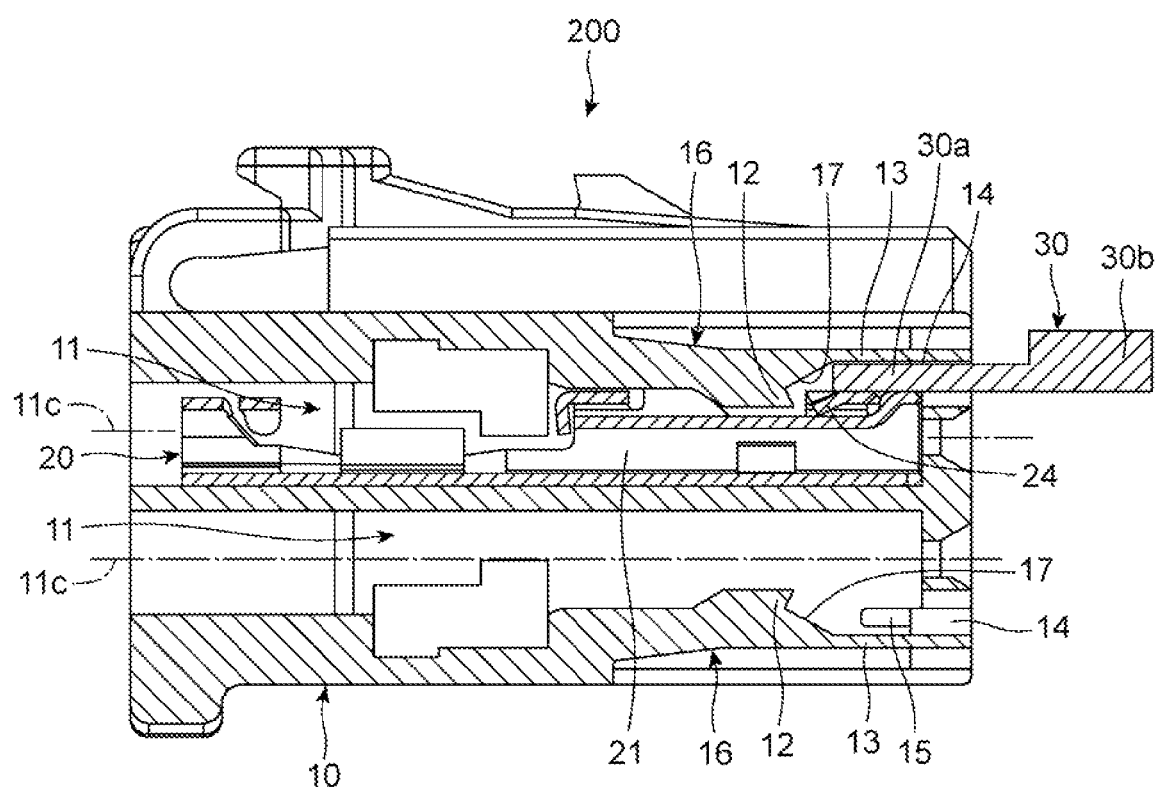
FIG. 10 is a cross-sectional view of the electric connector in accordance with the second embodiment, of the present invention, illustrating that a jig is inserted into the electric connector.
Figure 11:
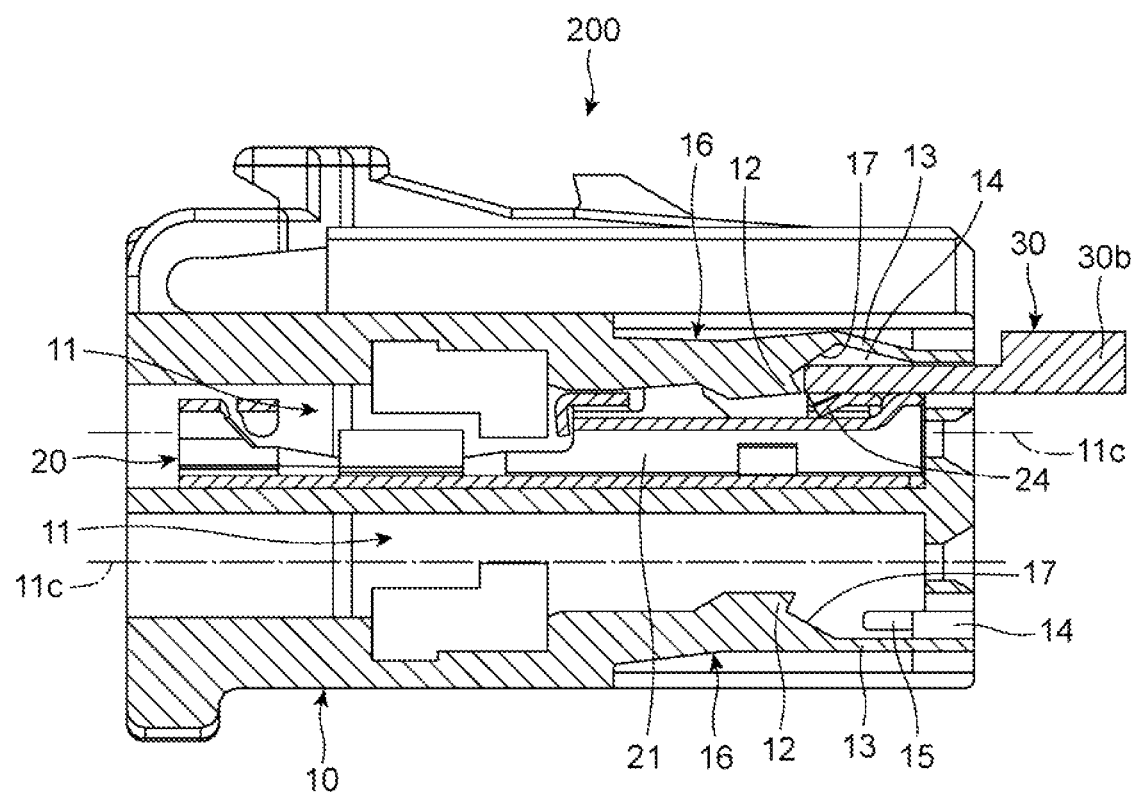
FIG. 11 is a cross-sectional view of the electric connector illustrated in FIG. 10, illustrating that the lance is disengaged from the terminal by means of a jig inserted into the electric connector.
Figure 12:
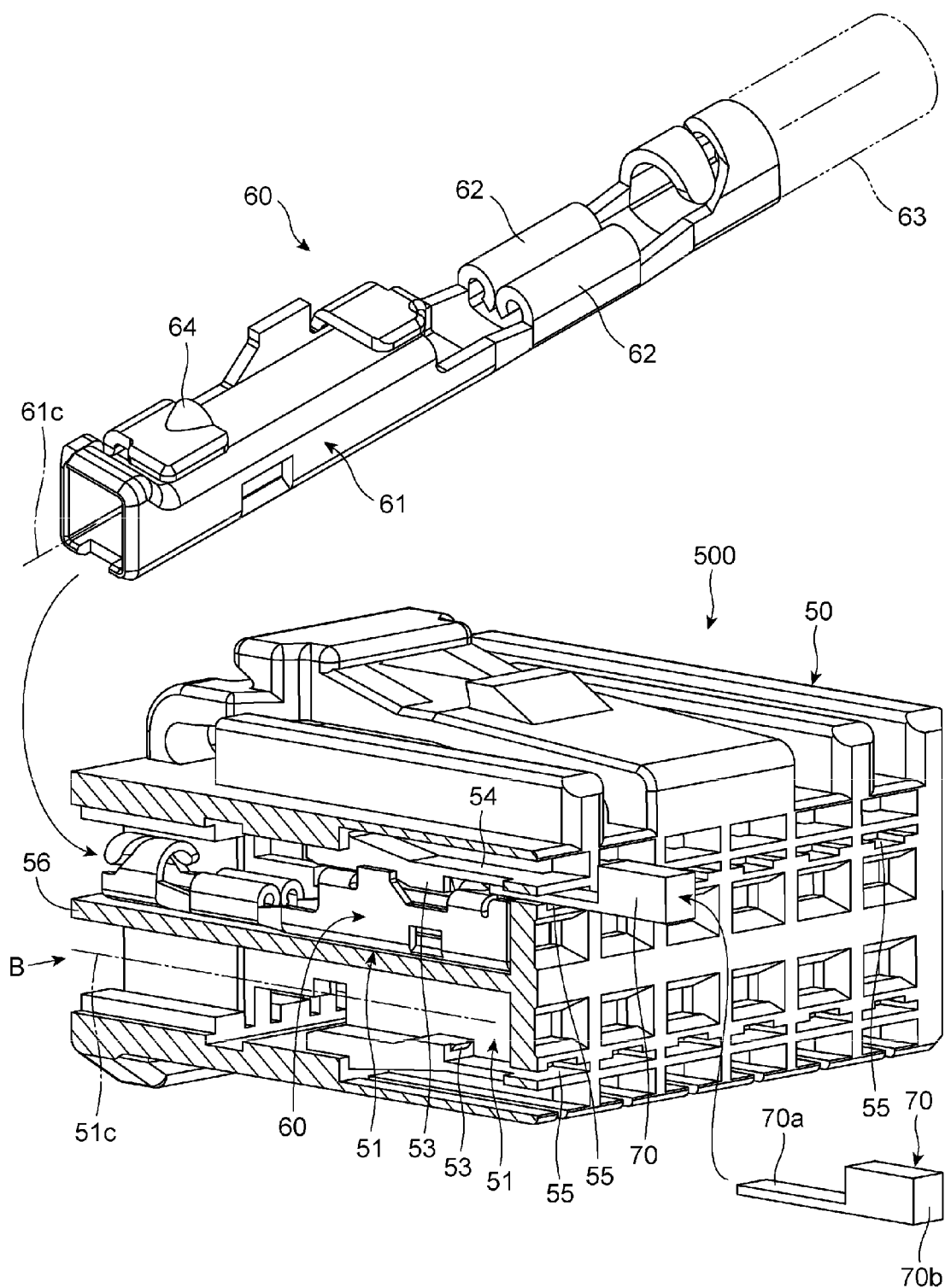
FIG. 12 is a cross-sectional perspective view of the conventional electric connector.
Figure 13:
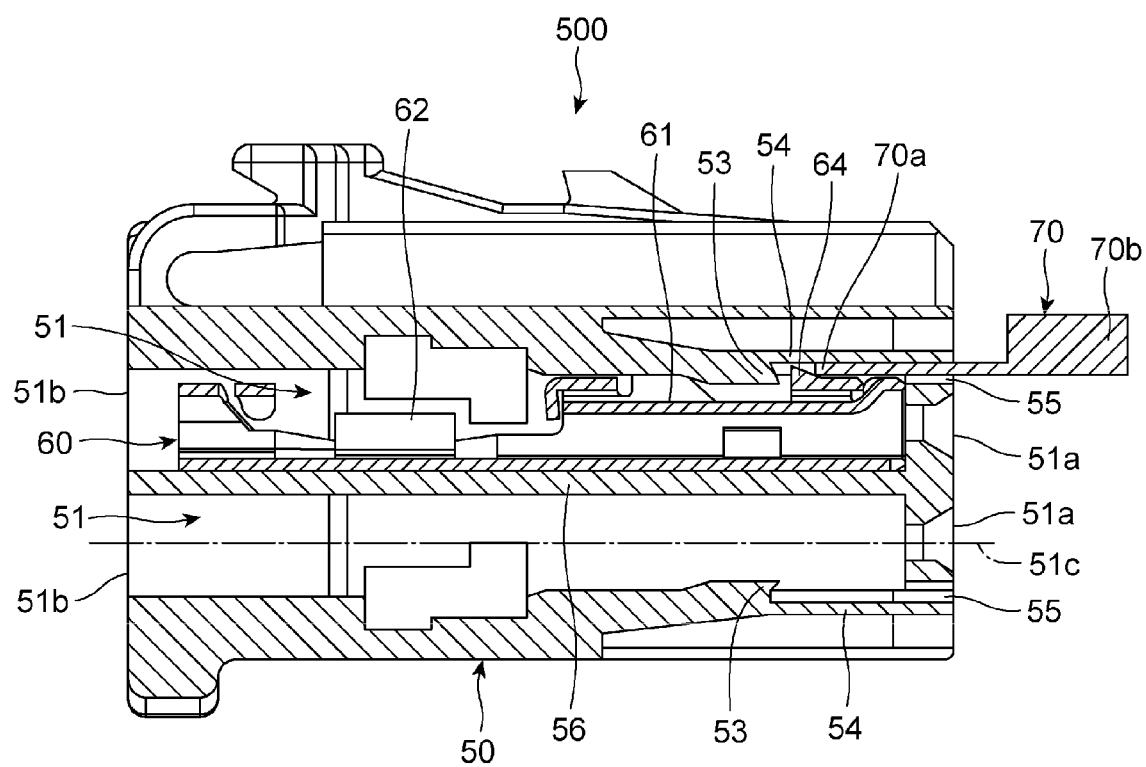
FIG. 13 is a cross-sectional view of the electric connector illustrated in FIG. 12, viewed in a direction indicated with the arrow B shown in FIG. 12.
Figure 14:
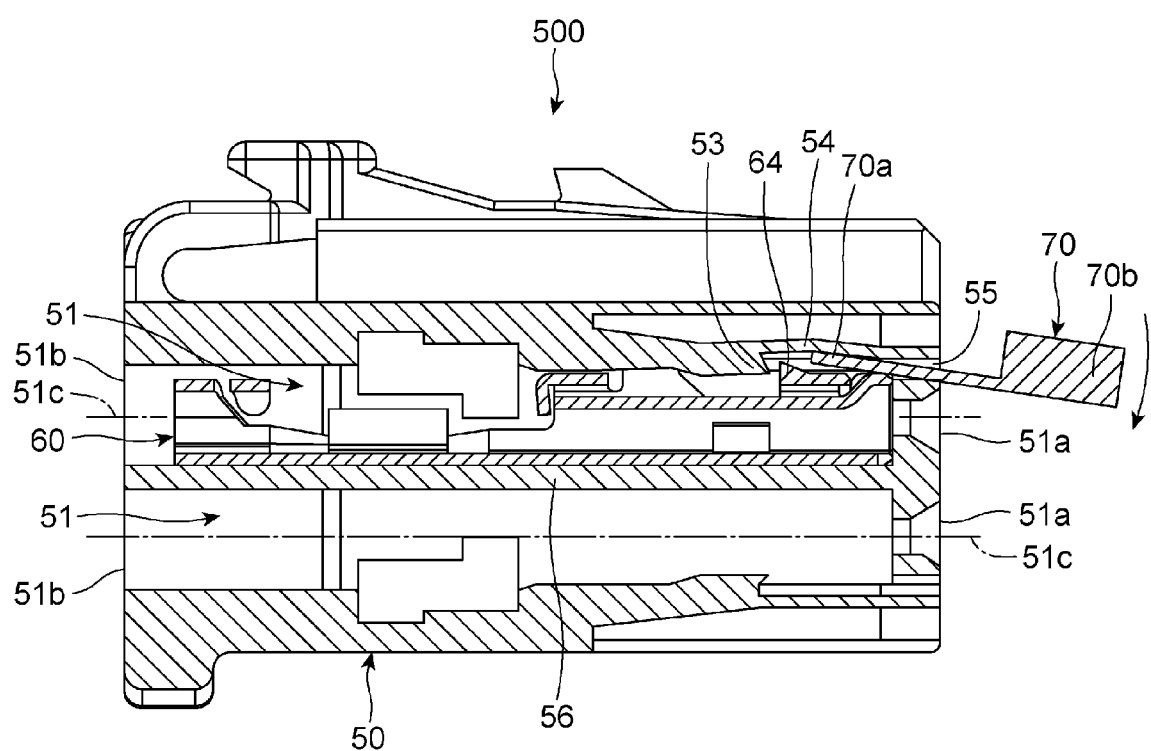
FIG. 14 is a cross-sectional view of the electric connector illustrated in FIG. 13, illustrating that the lance is disengaged from the terminal by means of a jig inserted into the electric connector.

Hereinbelow is explained an electric connector 200 in accordance with the second embodiment with reference to FIGS. 10 and 11. FIGS. 10 and 11 are cross-sectional views of the electric connector 200. Parts or elements of the electric connector 200 illustrated in FIGS. 10 and 11 that correspond to those of the electric connector 100 illustrated in FIGS. 1 to 9 have been provided with the same reference numerals, and operate in the same manner as corresponding parts or elements in the first embodiment, unless explicitly explained hereinbelow.

As illustrated in FIG. 10, the electric connector 200 in accordance with the second embodiment is designed to include a pressure transmitter 17 formed in the path 14 for deforming the lance 12 in a direction away from the terminal 20 when pressurized by the jig 30 inserted into the terminal space 11 through the path 14. The pressure transmitter 17 is defined by an inclined surface. The inclined surface 17 acting as the pressure transmitter inclines in a direction in which the inclined surface 17 comes closer to the axis 11c of the terminal space 11 in a direction in which the jig 30 is inserted into the terminal space 11.

In the electric connector 200 in accordance with the second embodiment, as illustrated in FIG. 11, the insertion portion 30a of the jig 30 inserted into the terminal space 11 through the path 14 makes contact with the inclined surface 17, and then, pushes up the lance 12. As a result, the lance 12 moves away from the engagement section 24 of the terminal 20. Thus, the steps of disengaging the lance 12 from the engagement section 24 can be simplified.

Furthermore, since the inclined surface 17 acting as the pressure transmitter is able to effectively convert a pressure exerted by the jig 30 when the jig 30 is inserted into the terminal space 11, into a force for disengaging the lance 12 from the engagement section 24, the lance 12 can be readily disengaged from the engagement section 24 of the terminal 20. Specifically, it is no longer necessary to incline the jig 30 such that the base 30b moves towards the axis 11c of the terminal space 11, unlike the steps of disengaging the lance 12 from the engagement section 24 in the electric connector 100 in accordance with the above-mentioned first embodiment.

Furthermore, the inclined surface 17 provides an advantage that since corners of the lance 12 situated in the vicinity of the resilient support 13 have an obtuse angle, stress concentration to the lance 12 can be avoided, ensuring that the lance 12 and the resilient support 13 can have an enhanced strength.

INDUSTRIAL APPLICABILITY

The electric connector in accordance with the present invention is able to be used broadly in various fields such as electric and electronic device industries and an automobile industry, as a wire connector for electrically connecting a circuit board and a wire harness to each other.

While the present invention has been described in connection with the electric connectors 100 and 200 in accordance with the first and second embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 2013-106530 filed on May 20, 2013 including specification, claims, drawings and summary is incorporated herein by reference in its entirety.

What is claimed is:

1. An electric connector comprising:
a housing composed of an electrically insulative material and forming therein a terminal space;
a terminal to be inserted into said terminal space, said terminal including a sheath section and an engagement section formed at said sheath section such that said engagement section does not protrude outwardly of said sheath section;
a lance protruding towards a central axis of said terminal space in said housing, said lance being configured to engage to and disengage from said engagement section of said terminal;
a resilient support supporting said lance such that said lance is resiliently deformable in a direction away from said central axis, said resilient support defining a wall partitioning said housing to form said terminal space;
a path through which a jig is to be inserted into said housing towards said lance, wherein said housing, said terminal, said lance, said resilient support, and said path are configured such that, when said terminal is in said terminal space, said path extends along said engagement section of said terminal towards said lance such that said jig is insertable at a distal end of said path between said resilient support and said sheath section until said jig abuts said lance; and
a pair of terminal supports horizontally facing each other such that said jig inserted into said housing through said path is located between said pair of terminal supports, and said pair of terminal supports make contact with said sheath section when said terminal is inserted into said housing.

2. The electric connector as set forth in claim 1, wherein said engagement section protrudes towards a central axis of said sheath section.

3. The electric connector as set forth in claim 2, further comprising a pressure transmitter formed in said path for deforming said lance in a direction away from said terminal when pressurized by said jig inserted into said housing through said path.

4. The electric connector as set forth in claim 3, wherein said pressure transmitter comprises an inclined surface inclining such that said inclined surface comes closer to said central axis of said terminal space along a direction in which said jig is inserted into said housing.

5. The electric connector as set forth in claim 1, further comprising a pressure transmitter formed in said path for deforming said lance in a direction away from said terminal when pressurized by said jig inserted into said housing through said path.

6. The electric connector as set forth in claim 5, wherein said pressure transmitter comprises an inclined surface inclining such that said inclined surface comes closer to said central axis of said terminal space along a direction in which said jig is inserted into said housing.

7. The electric connector as set forth in claim 1, wherein said lance is located at a proximal end of said resilient support closest to a rear opening of said terminal space into which said terminal is to be inserted.

* * * * *